United States Patent [19]
Kogan

[11] Patent Number: 6,091,619
[45] Date of Patent: Jul. 18, 2000

[54] ARRAY ARCHITECTURE FOR LONG RECORD LENGTH FAST-IN SLOW-OUT (FISO) ANALOG MEMORY

[75] Inventor: Grigory Kogan, Portland, Oreg.

[73] Assignee: Tektronix, Inc., Beaverton, Oreg.

[21] Appl. No.: 09/298,353

[22] Filed: Apr. 23, 1999

[51] Int. Cl.[7] .................................................. G11C 27/00
[52] U.S. Cl. ...................................... 365/45; 365/230.03
[58] Field of Search .................................. 365/45, 230.03

[56] References Cited

U.S. PATENT DOCUMENTS

| | | | |
|---|---|---|---|
| 4,271,488 | 6/1981 | Saxe ........................................ | 365/240 |
| 4,648,072 | 3/1987 | Hayes et al. ............................ | 365/45 |
| 4,922,452 | 5/1990 | Larsen et al. .......................... | 365/45 |
| 4,951,302 | 8/1990 | Peter et al. ............................. | 377/57 |
| 5,144,525 | 9/1992 | Saxe et al. .............................. | 365/45 |
| 5,200,983 | 4/1993 | Kogan .................................... | 377/57 |
| 5,406,507 | 4/1995 | Knierim et al. ........................ | 365/45 |
| 5,526,301 | 6/1996 | Saxe ........................................ | 365/45 |

*Primary Examiner*—Andrew Q. Tran
*Attorney, Agent, or Firm*—Boulden G. Griffith; Thomas F. Lenihan

[57] ABSTRACT

A very long linear input array capable of acquiring long series of acquisition data is achieved by breaking the long linear array into a series of sub-arrays, each enabled by a "global" set of enable signals. The individual cells of the local arrays are addressed by local x-y enable signals. This arrangement permits the acquisition of very long record lengths, without sacrificing the quality of other aspects of the acquisition process to excess capacitance.

6 Claims, 6 Drawing Sheets

ARRAY ARCHITECTURE FOR LONG RECORD LENGTH FAST-IN SLOW-OUT (FISO) ANALOG MEMORY

FIELD OF THE INVENTION

This invention relates to fast-in, slow-out high-speed signal acquisition arrays, and more particularly to such arrays with a very long continuous linear record lengths.

CROSS-REFERENCE TO RELATED APPLICATIONS

[not applicable]

STATEMENT REGARDING FEDERALLY SPONSORED RESEARCH AND DEVELOPMENT

[not applicable]

BACKGROUND OF THE INVENTION

Before describing the present invention, it will serve well to discuss some of the prior art in the area of signal sample acquisition and the immediate high-speed memory that serves it. As will be seen from the following discussion, part of the art of high speed data acquisition is in putting the acquisition memory as close to the raw input signal as possible, while taking care to preserve the sample integrity and present a high input impedance. The latter particularly includes minimizing the capacitive loading of the input signal.

U.S. Pat. No. 4,271,488 to Saxe for "High-Speed Acquisition System Employing An Analog Memory Matrix", hereby incorporated by reference, describes an acquisition system employing an analog memory matrix of sample-hold elements arranged in N×M rows and columns and connected to an analog signal bus. This memory may be written to very fast, and then read out at a more leisurely pace. It has therefore come to be known as a FISO, or "fast-in, slow-out" memory.

U.S. Pat. No. 4,648,072 to Hayes et al. for "High-Speed Data Acquisition Utilizing Multiplex Charge Transfer Devices", hereby incorporated by reference, describes two-phase charge coupled device (CCD) based acquisition memory. The two memories use opposite phases of the acquisition clock signal to demultiplex sample data from a single input line to achieve a doubling of acquisition speed. Each CCD memory has a delay line input, parallel internal structure, and a serial output. This is known as a serial-parallel-serial structure, or "SPS". See also, U.S. Pat. No. 4,951,302 to Peter et al. for "Charge-Coupled Device Shift Register", hereby incorporated by reference. And, further use of the CCD memory in an SPS layout is described in U.S. Pat. No. 5,200,983 for Kogan for "FISO Analog Signal Acquisition System Employing CCD Array Storage".

U.S. Pat. No. 4,922,452 to Larsen et al. for "10 Gigasample/sec Two-stage Analog Storage Integrated Circuit For Transient Digitizing and Imaging Oscillography", hereby incorporated by reference, describes an acquisition system employing a two-stage sampling cell at each x-y location. The first stage, or capture section, has a very small capacitor to collect samples at very high speed with minimum loading effect. When all of the first capture sections have data, a transfer gate is briefly opened to transfer the captured and buffered to the second, or storage, stage of the memory. The storage stage employs larger capacitors appropriate for storing samples for a longer period of time.

U.S. Pat. No. 5,144,525 to Saxe et al. for "Analog Acquisition System Including a High Speed Timing Generator", hereby incorporated by reference, describes various ways to produce a high speed sampling strobe for sampling data into FISO-type memories. The total time used to generate multiple strobes has to be made equal to the time required to fill a single row with data.

Then, access to that row is shut off, access to the next row is turned on, and another set of multiple strobes are used to put data into that next row.

U.S. Pat. No. 5,526,301 to Saxe for "High-Speed Analog Acquisition Including Signal Processing", hereby incorporated by reference, describes a system with a high-speed sequential sampling input circuit whose outputs are processed in parallel by multiple layers of signal processing units with a set of selectable functions. These selectable functions include: greater of the inputs as the output, the sum of two analog input levels as the output, either input multiplied by a variable as the output. The latter function can be used to selectively decimate the input samples and "steer" particular inputs to the final output layer of signal processing units. The use of variable multiplication factors allows this circuitry to be used as a finite impulse response filter.

U.S. Pat. No. 5,406,507 to Knierim et al. for "Reduced Input Capacitance Analog Storage Array", hereby incorporated by reference, describes a DRAM-like two-dimensional array of capacitors in which each cell communicates with a column line through x-y addressing devices, and each column communicates with the input line through a column separation device.

Over the years, the importance of record length as a competitive factor in oscillography has increased, making it more and more important to achieve depth of acquisition, as well as signal integrity and high input impedance. The invention described below therefore has as one of its objectives the attainment of very long record lengths, while maintaining the quality of other aspects of the acquisition process.

As is described in U.S. Pat. No. 4,271,488 to Saxe for "High-Speed Acquisition System Employing an Analog Memory Matrix" and U.S. Pat. No. 5,144,525 to Saxe et al. for "Analog Acquisition System Including a High Speed Timing Generator", values are read into the sample cells by charging them to a voltage level, $V_{CAP}$, proportional to the voltage value of the input signal at that point in time. Refer to FIGS. 1 and 2. The capacitors in the storage cells then hold a charge, $Q_{CAP}$, that is the product of the sampled voltages, $V_{CAP}$, and the size of the capacitors, $C_{CAP}$, in the storage cells. The elements of the storage cells are desirably made to be as uniform as possible from cell to cell, so as to minimize any distortion that they would otherwise create in the acquired data.

Acquisition Cell 1, Acquisition Cell 2, and all the other acquisition cells, comprise a strobe controlled switch, an acquisition capacitor, and an output buffer amplifier. (See, for example, U.S. Pat. No. 5,144,525, FIG. 20, elements 110 and 116.) The switch is briefly closed by a strobe signal, thereby temporarily connecting the analog signal line to the acquisition capacitor. The output buffer amplifier then presents a voltage that is representative of the charge on the acquisition capacitor to a column of memory cells in the array of memory cells.

In the read-out cycle used with such an acquisition memory, typically all of the column enable signals are pre-charged to the power supply voltage, $V_{DD}$, while the row enable signal remains inactive. The charge on each column is then $Q_{COL}$, which is the product of the column's capacitance, $C_{COL}$, and the power supply voltage, $V_{DD}$. As each row enable signal is then sequentially activated and deactivated, it connects the storage cell charge, $Q_{CAP}$, and the column charge, $Q_{COL}$, to each other. The common voltage that results, $V_{COM}$, is equal to the sum of the charges, $Q_{CAP}$ and $Q_{COL}$, divided by the sum of the capacitances $C_{CAP}$ and $C_{COL}$.

$$V_{COM} = [Q_{CAP} + Q_{COL}]/[C_{CAP} + C_{COL}]$$
$$= [(C_{CAP} \times V_{CAP}) + (C_{COL} \times V_{DD})]/[C_{CAP} + C_{COL}]$$
$$= [C_{CAP} \times V_{CAP}]/[C_{CAP} + C_{COL}] + [C_{COL} \times V_{DD}]/[C_{CAP} + C_{COL}]$$

where, $[C_{COL} \times V_{DD}]/[C_{CAP}+C_{COL}]$ is a portion of the $V_{COM}$ signal that is determined by the cell and column geometries and power supply voltage. In operation, this part of the $V_{COM}$ values is constant and therefore needs to be subtracted from each of the $V_{COM}$ values at some point in the process.

The other part of the $V_{COM}$ values, $[C_{CAP} \times V_{CAP}]/[C_{CAP}+C_{COL}]$, which can be rearranged as $V_{CAP}/[1+C_{COL}/C_{CAP}]$, is proportional to $V_{CAP}$ and inversely proportional to the ratio $C_{COL}/C_{CAP}$. Increasing the length of rows, to increase array size, has the undesirable effect of increasing $C_{COL}$, and thereby decreasing the size of the useful value compared with the constant part. Since the useful part of the signal is obtained by subtracting the common part from the total, this has an adverse effect on the signal-to-noise ratio and linearity, or overall signal fidelity.

BRIEF SUMMARY OF THE INVENTION

The present invention achieves very long record lengths, without sacrificing the quality of other aspects of the acquisition process. This is achieved by breaking a very long linear input array into a series of sub-arrays, each enabled by a "global" set of enable signals, and accessing the individual cells of the local arrays using local x-y enable signals.

DETAILED DESCRIPTION OF THE INVENTION

Figure 1:
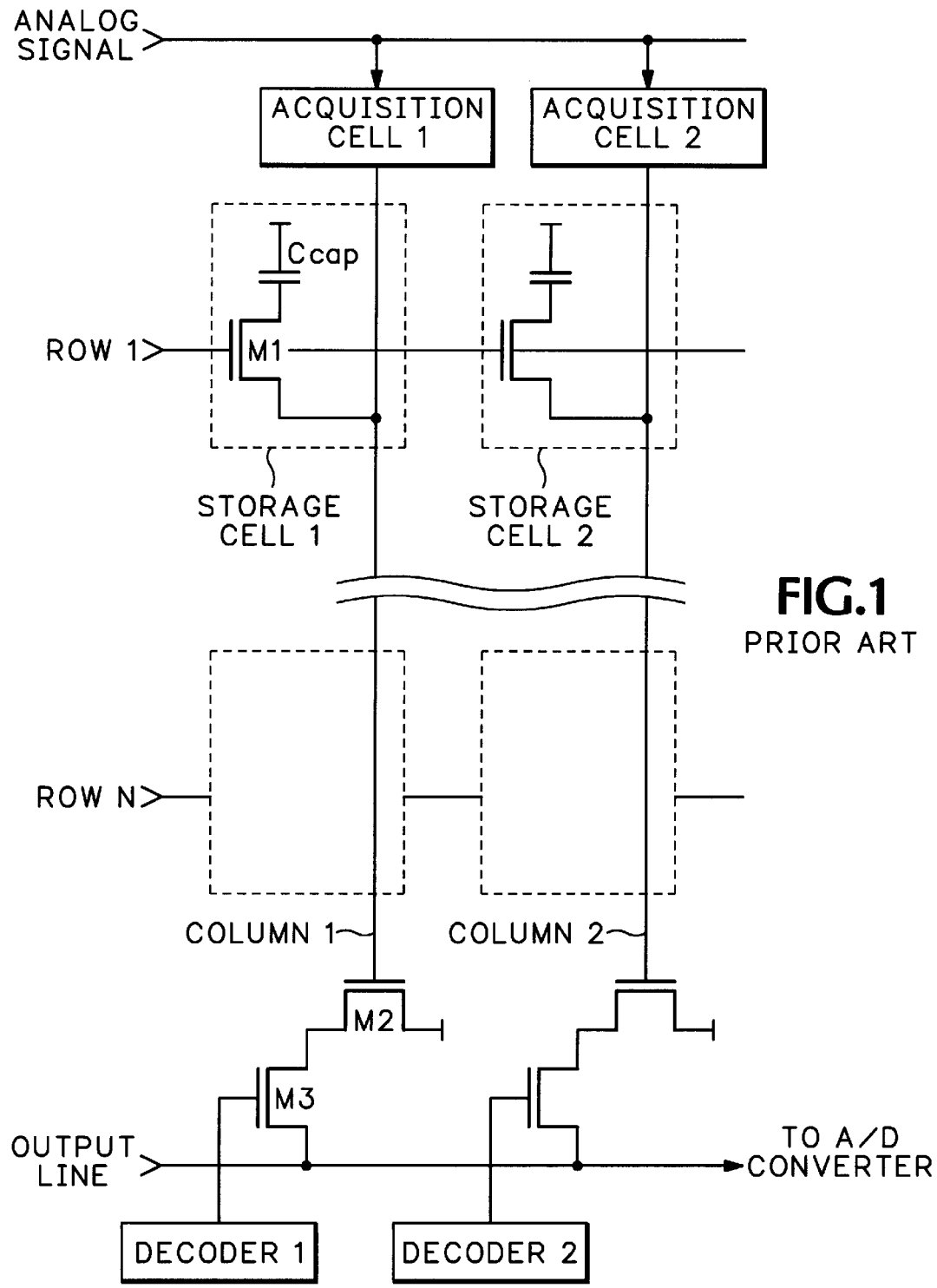
FIG. 1 is partial block diagram illustrating the layout of an acquisition storage memory according to the prior art.
Figure 2:
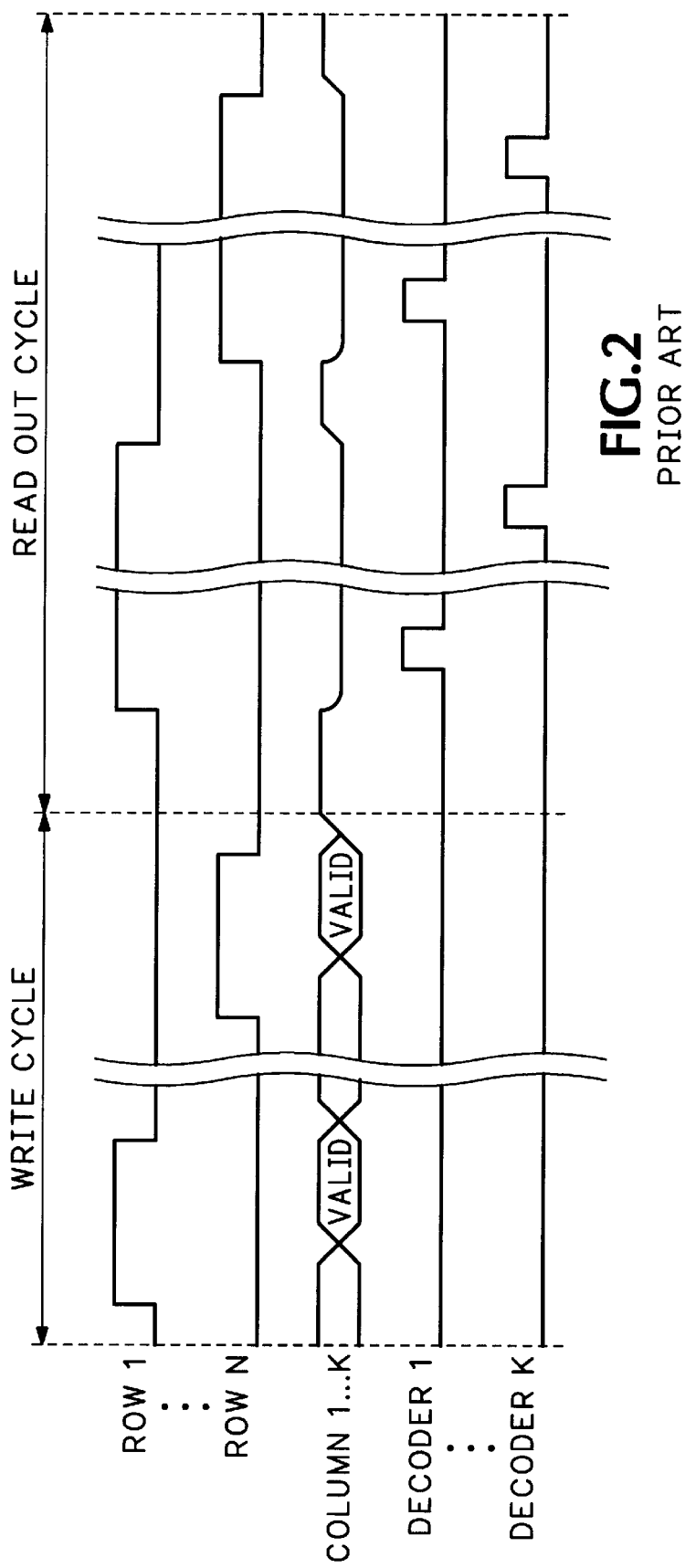
FIG. 2 is a simplified timing diagram illustrating the operation of circuitry shown in FIG. 1 according to the prior art.
Figure 3:
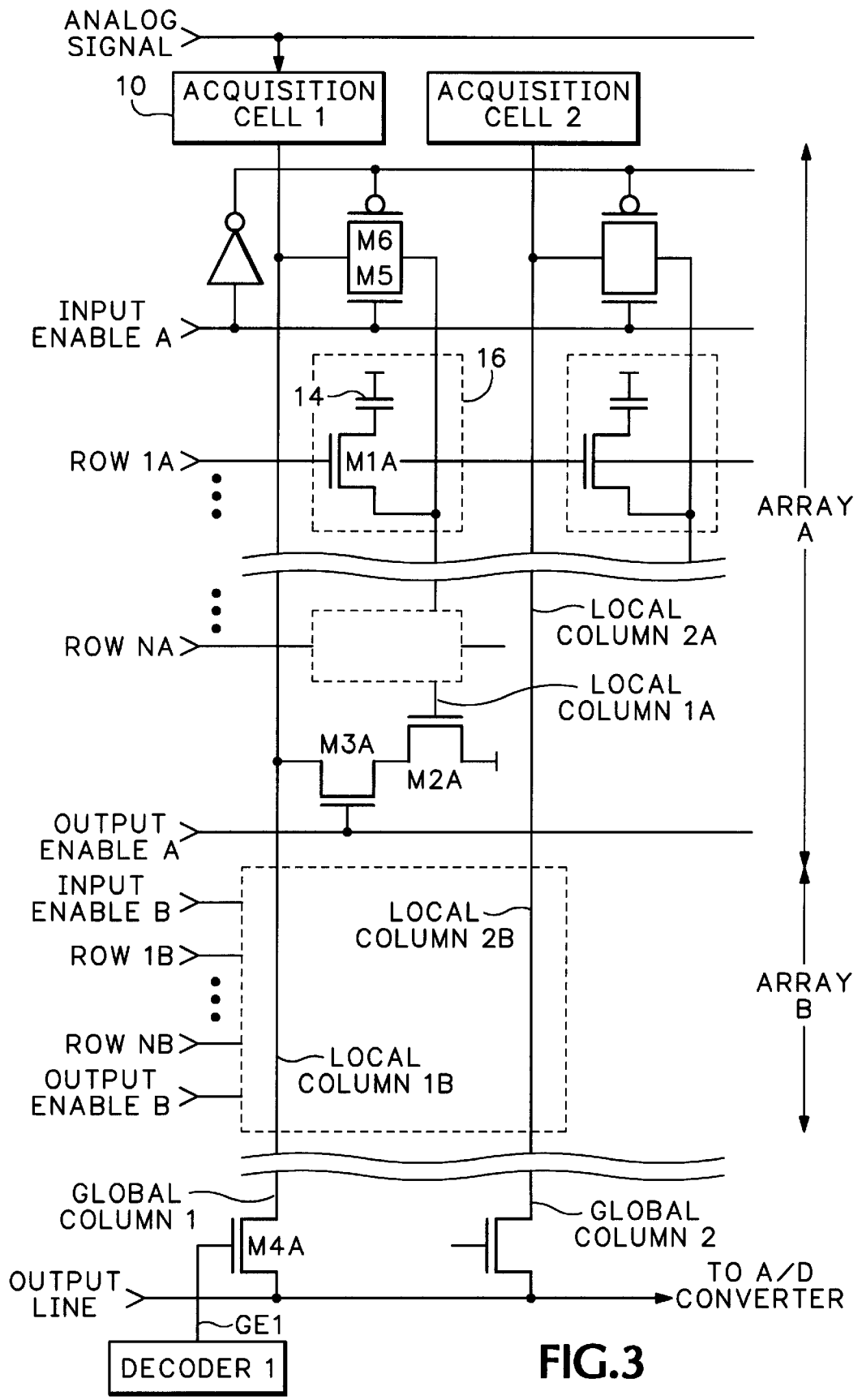
FIG. 3 is a partial block diagram illustrating the layout of an acquisition storage memory according to the present invention.

Referring now to FIG. 3, in accordance with the present invention, a linear array has been broken into multiple sub-arrays, each of which is interacted with via a global column line, e.g., GLOBAL COLUMN 1 or GLOBAL COLUMN 2. Each global column is selected by a global column enable signal, e.g., GE1. Within each global column there are a number of local columns, such as LOCAL COLUMN 1A and LOCAL COLUMN 1B. Each local column has associated with it a set of row enable signals. In FIG. 3 these are ROW 1A through ROW NA, associated with LOCAL COLUMN 1A, and ROW 1B through ROW NB, associated with LOCAL COLUMN 1B. Thus, each memory storage cell shown in FIG. 3 has a local row address, a local column address, and a global column address, all of which must be active at the same time in order to access that particular storage cell.

Additionally, each memory cell array needs an input enable signal in order to be written to, and an output enable signal in order to be read from. When activated, INPUT ENABLE A and its inverted counterpart close the electronic switch consisting of complementary MOSFET transistors M6 and M5, thereby connecting the output of Acquisition Cell 1 10 to LOCAL COLUMN 1 A via GLOBAL COLUMN 1. In the same manner, INPUT ENABLE B connects Acquisition Cell 1 10 to LOCAL COLUMN B via GLOBAL COLUMN 1, and so on, through however many local columns are associated with each global column. Typically, there will be from three to ten local columns per global column.

During a read cycle, all of the INPUT ENABLE signals are held "off". During an initial portion of the read cycle, the pre-charge time, the LOCAL COLUMNS 1A, 1B, etc., are all pre-charged to the level of the voltage supply $V_{DD}$ while all of the row enable signals and INPUT ENABLE A and OUTPUT ENABLE A are held off. While all of the other enable signals are off and OUTPUT ENABLE A goes active-high, it closes electronic switch M3A to connect GLOBAL COLUMN 1 to the drain of transistor M2A. The gate of transistor M2A is connected to LOCAL COLUMN 1A. Therefore, when OUTPUT ENABLE A is active and M3A is conducting, the voltage on the LOCAL COLUMN 1A controls the voltage on the GLOBAL COLUMN 1. And, when GLOBAL COLUMN 1 is active and M4A is conducting, the voltage on GLOBAL COLUMN 1 is connected to the OUTPUT LINE, and thereby to an A/D Converter (not shown) where it is converted to a digital value for further processing.

During the time that each row enable signal, ROW 1A through ROW NA, are active, LOCAL COLUMN 1A through NA (not shown) each go active one at a time. Thus LOCAL COLUMNS 1A through NA are simultaneously loaded with data, and then read serially. This sequentially connects each memory cell 16 storage capacitor 14 associated with LOCAL COLUMNS 1A through NA to the AID Converter via the GLOBAL COLUMN 1 line and M4A.

Figure 4:
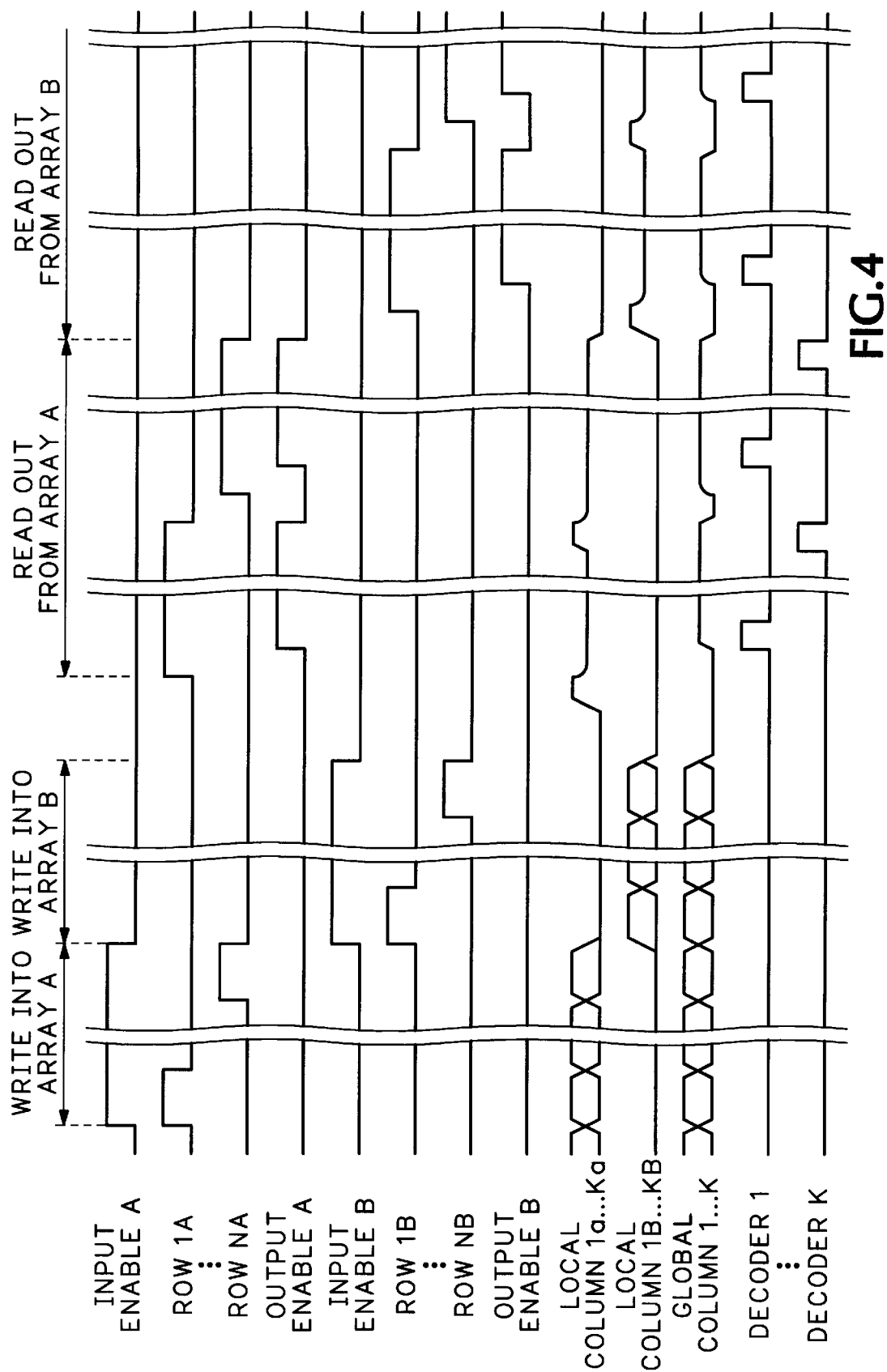
FIG. 4 is a simplified timing diagram illustrating the operation of the circuitry shown in FIG. 3 according to the present invention.

Referring now to FIG. 4, example write cycles are illustrated on the left, while example read cycles are shown on the right. During each of those times, local column enable signals ROW 1A through LOCAL COLUMN KA each go active. Finally, during each local column interval, the global columns, GLOBAL COLUMN 1 through GLOBAL COLUMN K each track the activity of the local columns, LOCAL COLUMN 1A through LOCAL COLUMN KA.

In a similar manner, during the time that INPUT ENABLE B is active, row enable signals ROW 1A through ROW NA each go active for a period of time. And, during each of those times LOCAL COLUMN 1A through LOCAL COLUMN KA each go active. Finally, during each row interval, the global columns, GLOBAL COLUMN 1 through GLOBAL COLUMN K each track the activity of the local columns, LOCAL COLUMN 1A through LOCAL COLUMN KA. All of the memory cells in the array of arrays are thereby sequentially connected to acquisition cells through the local column and global column associated with each respective acquisition cell.

When it is time to read the stored values out, OUTPUT ENABLE A goes active while each of ROW 1A through ROW NA are active. During an initial interval, during which the row enable signal is active but the output enable signal is not active, LOCAL COLUMN 1A through LOCAL COLUMN KA are pre-charged to $V_{DD}$, while the row enable and output enable signals are not active.

Then the output enable signal for that array goes active, and the local column signals are each sequentially activated. The global columns track the voltages on the local columns to which they are connected. Decoder outputs 1 through K each go active once during each array read interval, thereby determining which global column is connected to the output line and A/D Converter 20 at any particular time.

Figure 5:
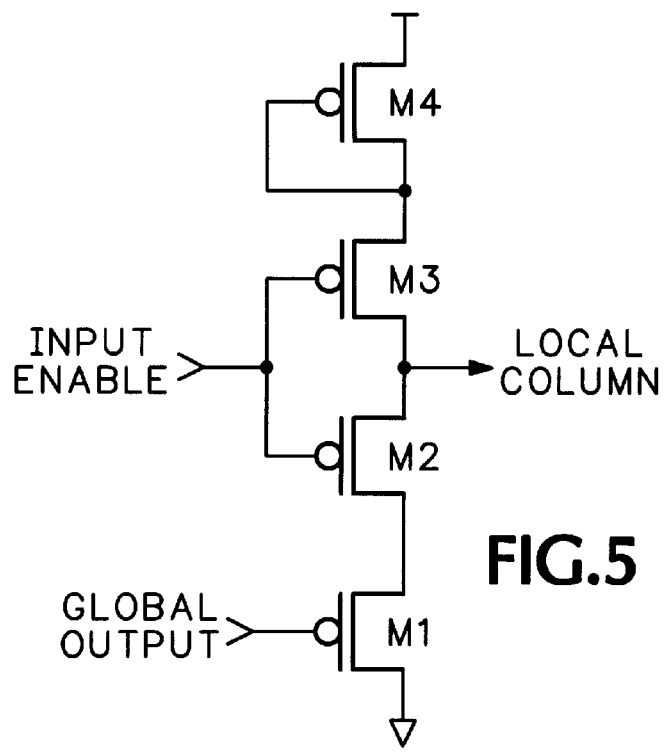
FIG. 5 is a schematic diagram showing alternative circuitry to provide control of acquisition memory input according to the present invention.

While one method of connecting the interface between the global and local columns has been drawn and described, many other approaches also work. Referring now to FIG. 5, we see that the INPUT ENABLE signal can control transistor switches M3 and M2, with the LOCAL COLUMN connected to the node connecting the drain of M2 to the source of M3. The GLOBAL COLUMN signal can be used to control M1, which operates to connect the source of M2 to ground when the GLOBAL COLUMN signal is active. In this arrangement, transistor M4 is connected to operate as a diode, with its gate connected to its source and its drain connected to the acquisition cell 10.

With this arrangement, the acquisition cell output does not have to drive the capacitance in the local column. The circuit includes a source follower with GLOBAL COLUMN as analog input, and LOCAL COLUMN as analog output. With this arrangement, the acquisition cell output is less capacitive; it does not have to drive the capacitance of the local column.

The topology shown in FIG. 3 has the acquisition cell 10 driving the global column and (through M5 and M6) the local column, so that the load on the acquisition cell output is the sum of the GLOBAL COLUMN capacitance and the capacitance of one LOCAL COLUMN.

Figure 6:
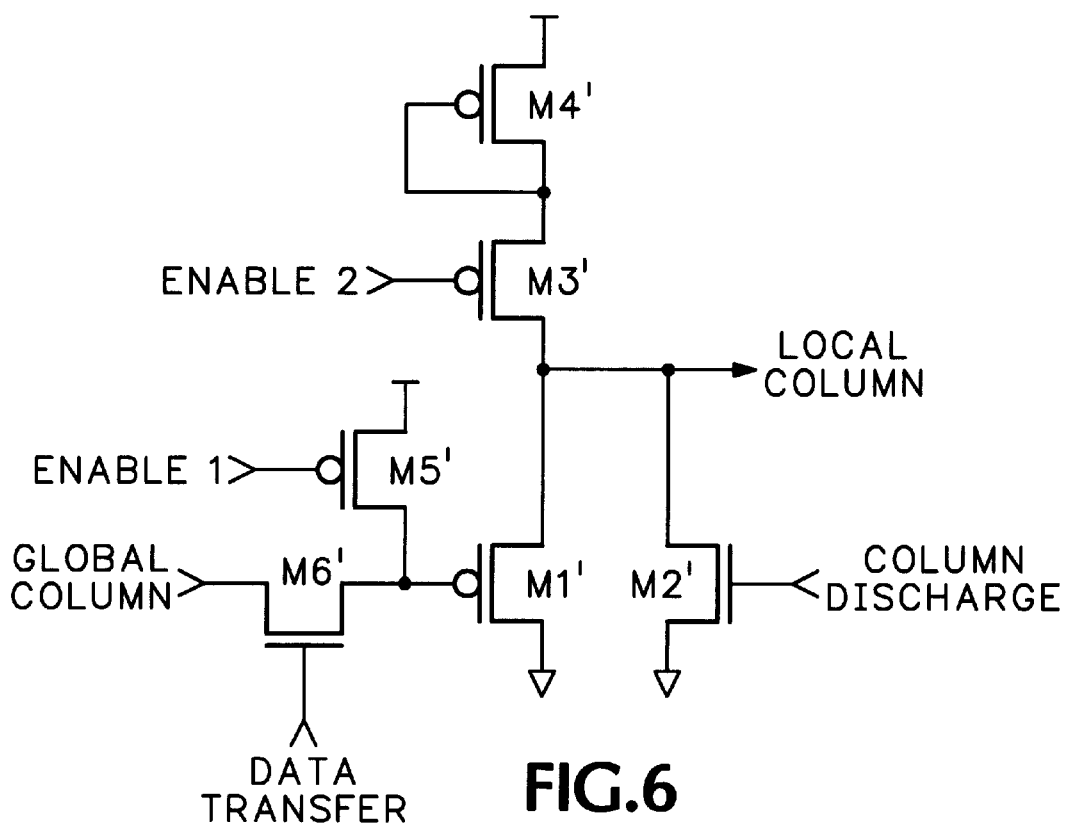
FIG. 6 is a schematic diagram showing alternative circuitry in the form of a cell to provide control of acquisition memory input according to the present invention.
Figure 7:
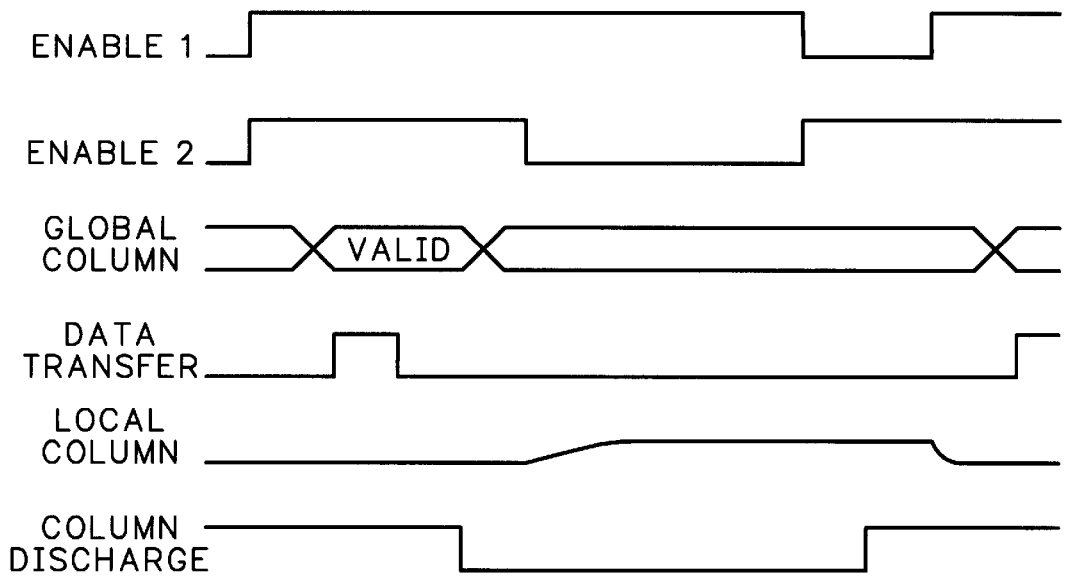
FIG. 7 is a timing diagram showing the operation of the circuitry shown in FIG. 6 during an input cycle.

Referring next to FIGS. 6 and 7, in order to reduce the load on the acquisition cell 10, the acquisition cell drives only the GLOBAL COLUMN, and it in turn drives a "repeater" which in turn drives the LOCAL COLUMN. The "repeater" consists of most of what is shown in FIG. 7.

M11 and M41 form a source follower. M61 provides data capture on the input of M11. Thus, the DATA TRANSFER signal operates as a track and hold control for the input from GLOBAL COLUMN. M51 disables M11 when ENABLE1 is low, and operates as an input enable when it is high. M31 disables M41 when ENABLE2 is high.

FIG. 7 illustrates the operation of the circuitry of FIG. 6 during the input cycle, and assumes it is disabled during an output cycle. The circuitry in FIG. 6 including transistors M1' through M6' can be viewed as a substitute for M5, M6 and the INPUT ENABLE signal in FIG. 3. Alternatively, the circuitry of FIG. 6 can be viewed as an independent cell, with input, output and enable, in which case ENABLE1 is the INPUT ENABLE, and /ENABLE2 corresponds with the OUTPUT ENABLE in FIG. 3. A unity gain amplifier can also act as substitute input circuitry in FIG. 3.

Referring now to FIG. 7, as well as FIG. 6, ENABLE1 going high acts to enable the input, which is the data on the GLOBAL COLUMN line. The high on ENABLE2 disables the output path through M11, presenting a maximum impedance to the GLOBAL COLUMN line when M61 is closed by a high DATA TRANSFER signal. The DATA TRANSFER signal goes high during the time when the input on the GLOBAL COLUMN line is valid. When ENABLE2 goes low, the LOCAL COLUMN responds by going to a voltage value that is representative of the voltage sampled from the GLOBAL COLUMN line. The LOCAL COLUMN is clamped to zero by the appearance of the high level on COLUMN DISCHARGE, thus turning on M21 and connecting the LOCAL COLUMN to ground.

Figure 8:
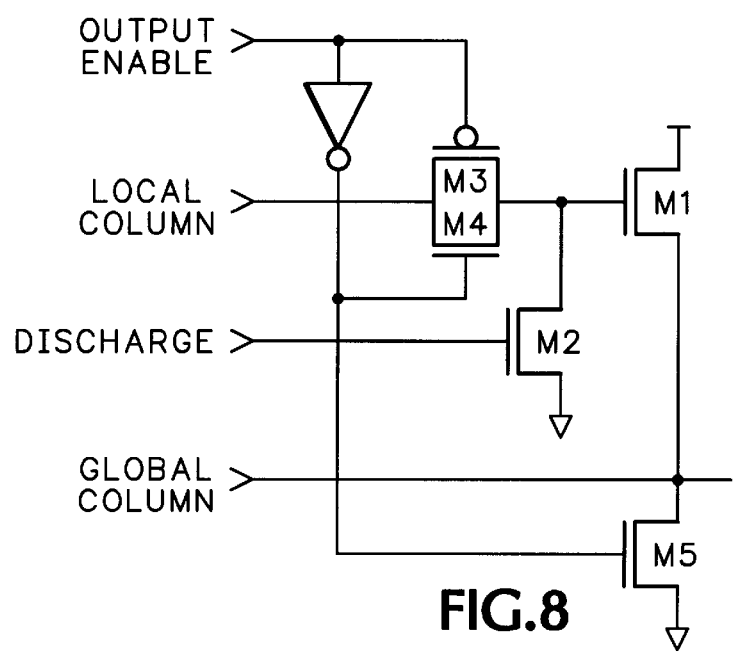
FIG. 8 is a schematic diagram showing alternative circuitry to provide control of acquisition memory output according to the present invention.

The circuitry shown in FIG. 8 is a substitute for M2A and M3A in the FIG. 3. It is a source follower that is enabled only during read back. It takes voltage from the LOCAL COLUMN and produces corresponding voltage on the GLOBAL COLUMN. As a cell, the circuitry in FIG. 8 is enabled when the OUTPUT ENABLE signal goes low, turning on M32, M42, and turning off M52. At about the same time, the DISCHARGE signal goes low, opening M22. LOCAL COLUMN is the data input, and GLOBAL COLUMN is data output. Input and output of the cell are enabled or disabled at the same time. While M22 is open and M32, M42, and M52 are closed (conducting), the voltage level of the LOCAL COLUMN line controls the voltage on the GLOBAL COLUMN line.

While a preferred embodiment of the present invention has been shown and described, it will be apparent to those skilled in the art that many changes and modifications may be made without departing from the invention in its broader aspects. The claims that follow are therefore intended to cover all such changes and modifications as are permitted by the patent laws of the respective countries in which this patent is granted.

I claim:

1. An acquisition memory structure for storing acquisition data for a long continuous series of samples, comprising:

a plurality of arrays of memory cells, each array having a plurality of individual memory cells, the memory cells of each of said arrays being arranged in at least first and second rows and in at least first and second columns, with each memory cell being enabled by control signals including a combination of a local row signal and a local column signal;

an analog signal input connected in parallel to each of a plurality of acquisition cells, said plurality of acquisition cells including at least first and second acquisition cells;

wherein said first and second local columns of memory cells are associated with one of the arrays of memory cells in the plurality of arrays, with each local column coupled to receive the output of said first and second acquisition cells, respectively; and a decoder for developing a control signal for enabling a first global column to which each of said first local columns of each array is coupled.

2. An acquisition memory structure according to claim 1 wherein a plurality of enable signals is associated with and serves to enable one particular array in said plurality of arrays.

3. An acquisition memory structure according to claim 1 wherein said control signals select the memory cells to be activated by closing an electronic switch connecting an output line of only one array to a particular global output line.

4. An acquisition memory structure according to claim 3 wherein the electronic switch is a field effect transistor.

5. An acquisition memory structure according to claim 1 wherein an input enable signal specific to each array of the plurality of arrays readies that particular array to receive inputs.

6. An acquisition memory structure according to claim 1 wherein an output enable signal specific to each array of the plurality of arrays readies that particular array to produce outputs.

* * * * *